US006492850B2

(12) United States Patent
Kato et al.

(10) Patent No.: US 6,492,850 B2
(45) Date of Patent: Dec. 10, 2002

(54) SEMICONDUCTOR INTEGRATED CIRCUIT AND METHOD FOR GENERATING INTERNAL SUPPLY VOLTAGE IN SEMICONDUCTOR INTEGRATED CIRCUIT

(75) Inventors: Yoshiharu Kato, Kasugai (JP); Nobuyoshi Wakasugi, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/159,129

(22) Filed: Jun. 3, 2002

(65) Prior Publication Data

US 2002/0140468 A1 Oct. 3, 2002

Related U.S. Application Data

(63) Continuation of application No. 09/754,115, filed on Jan. 5, 2001, now abandoned.

(30) Foreign Application Priority Data

Jan. 27, 2000 (JP) ....................................... 2000-018315

(51) Int. Cl.[7] ................................................ H03K 17/22
(52) U.S. Cl. ........................................ 327/143; 327/198
(58) Field of Search ................................ 327/143, 198, 327/540, 541; 323/316

(56) References Cited

U.S. PATENT DOCUMENTS 4,142,118 A 2/1979 Guritzi ....................... 327/143
5,319,601 A 6/1994 Kawata et al. .............. 327/143
5,469,099 A 11/1995 Konishi ....................... 327/143
5,519,347 A 5/1996 Kim ........................... 327/143
5,565,811 A 10/1996 Park et al. .................. 327/143
5,936,443 A 8/1999 Yasuda et al. .............. 327/143
5,994,888 A 11/1999 Yanagawa ................... 323/314
6,011,428 A 1/2000 Tsukude et al. ............ 327/541

FOREIGN PATENT DOCUMENTS

JP 07-130170 5/1995

*Primary Examiner*—Terry D. Cunningham
(74) *Attorney, Agent, or Firm*—Arent Fox Kintner Plotkin & Kahn

(57) ABSTRACT

The invention aims at securely generating an internal supply voltage when turning on the power supply of internal circuits in a semiconductor integrated circuit where the operation voltage is low, and securely resetting the internal circuits. The voltage generator generates an internal supply voltage supplied to the internal circuits based on the reference voltage by using the external supply voltage supplied from the exterior. That is, the voltage generator forcibly supplies the external supply voltage as internal supply voltage when the power-on reset signal is activated. Therefore, when the external supply voltage is low at the time of turning-on of the power, and the voltage generator does not operate normally, the internal supply voltage can be securely generated following the external supply voltage so as to be supplied to the internal circuits.

17 Claims, 8 Drawing Sheets

Prior Art

Prior Art

SEMICONDUCTOR INTEGRATED CIRCUIT AND METHOD FOR GENERATING INTERNAL SUPPLY VOLTAGE IN SEMICONDUCTOR INTEGRATED CIRCUIT

This is a Continuation of application Ser. No. 09/754,115, filed Jan. 5, 2001. The disclosure of the prior application is hereby incorporated by reference herein in its entirety, now abandoned.

BACKGROUND OF THE INVENTION

1. Field of the Invention

The present invention relates to a semiconductor integrated circuit having a power supply circuit that generates an internal supply voltage using an external power supply voltage, and a method for generating the internal supply voltage in the semiconductor integrated circuit.

2. Description of the Related Art

Recently, portable equipment driven by batteries has come into wide use. It is requested that a semiconductor integrated circuit mounted in the portable equipment is of a low power consumption specification in order to ensure a long life of the batteries. In many cases, this type of a semiconductor integrated circuit has a voltage generator that generates an internal supply voltage whose voltage is lower than an external supply voltage by using the external supply voltage supplied from the outside thereof, and low power consumption has been achieved by supplying the internal supply voltage into predetermined circuits. Recently, a semiconductor integrated circuit is internally provided with a plurality of voltage generators, wherein a plurality of kinds of internal supply voltage is respectively supplied into the major circuit blocks.

FIG. 1 shows an example of the major circuits to generate an internal supply circuit in a semiconductor integrated circuit.

A reference voltage generator 1 has a current-mirror circuit 1*a,* and generates reference voltage VREF by using an external supply voltage VEXT. A power-on reset circuit 2 inactivates a power-on reset signal POR (that is, to make the power-on reset signal enter a lower level) when the external supply power VEXT exceeds a predetermined value. The current-mirror circuit 1*a* has a function by which the reference voltage VREF is forcibly made into the external supply voltage VEXT upon receiving a high-leveled power-on reset signal POR. The reference generator 1 generates the reference voltage VREF, following the external supply voltage VEXT, by the power-on reset signal POR when the external supply voltage VEXT is low and the reference voltage VREF cannot be generated by the current-mirror circuit la. That is, the reference voltage VREF can be steadily generated where the external supply voltage VEXT is low.

A voltage generator 3 has a differential amplifier 3*a* composed of a current-mirror circuit, and a regulator 3*b* composed of a pMOS transistor. The differential amplifier 3*a* controls the regulator 3*b* upon receiving the reference voltage VREF and the fed-back internal supply voltage VINT. The regulator 3*b* generates an internal supply voltage having predetermined drive capacity.

An example in which the reference generator is controlled by the power-on reset signal POR is disclosed in Japanese Unexamined Patent Application Publication No. Hei-130170.

However, the current supply capacity of supply voltage VEXT generated by batteries is lower in comparison with the current supply capacity of general power supplies. Therefore, for example, when the respective circuits of semiconductor integrated circuits mounted in portable equipment operates as a whole when the power is turned on, there are cases where the supply voltage VEXT is temporarily lowered.

FIG. 2 shows the voltage waveform when the supply voltage VEXT is lowered.

As the external supply voltage VEXT is temporarily lowered when the power is turned on, the differential amplifier 3*a* of the voltage generator 3 shown in FIG. 1 does not operate normally, and a feedthrough current occurs. Resultantly, such a problem occurs, by which the internal supply voltage VINT does not rise to a normal level. In particular, the above-described problem is likely to occur where the differential amplifier 3*a* is composed of a CMOS circuit. The reason resides in that the external supply voltage VEXT supplied is required to be greater by two or more times than the threshold voltage of a transistor in order to steadily actuate the differential amplifier 3*a* (current-mirror circuit). That is, the CMOS differential amplifier has a smaller operating margin at its low voltage side.

Further, generally, in a semiconductor integrated circuit mounted in portable equipment, the operational voltage is reduced in order to lower the power consumption (For example, the external supply voltage is 2.5V). Since the threshold voltage of the transistor scarcely depends on the external supply voltage, the ratio of the threshold voltage of the transistor to the external supply voltage VEXT is increased, wherein the above-described problem is still likely to occur.

In addition, as shown in FIG. 2, the timing of generation of the internal supply voltage VINT shifts, wherein as the power-on reset signal POR is inactivated (going to a low level) before the internal supply voltage VINT is raised to a normal voltage, circuits that are required to be reset in the semiconductor integrated circuit will be activated before a normal internal supply voltage VINT is supplied. As a result, these circuits are not correctly reset, there is a possibility of the portable equipment being hung up.

On the other hand, as described above, the reference voltage generator 1 generates the reference voltage VREF, following the external supply voltage VEXT, by a power-on reset signal POR when the power is turned on. However, when the voltage generator 3 for receiving the reference voltage VREF has a CMOS differential amplifier 3*a,* the voltage generator does not operate normally in a region where the external supply voltage VEXT is low even if the voltage generator 3 receives the reference voltage VREF following the external supply voltage VEXT. Therefore, the voltage generator 3 cannot generate a normal internal supply voltage VINT.

SUMMARY OF THE INVENTION

An object of the present invention is to reliably generate an internal supply voltage when an external supply voltage supplied to a semiconductor integrated circuit is low and, in particular, to quickly raise the internal supply voltage following the external supply voltage when the power is turned on.

Another object of the present invention is to securely generate an internal supply voltage in a voltage generator having a CMOS current-mirror circuit even when the supply voltage supplied to the CMOS current-mirror circuit is low.

Still another object of the present invention is to reliably reset an internal circuit supplied with the internal supply voltage.

According to one of the aspects of the semiconductor integrated circuit in the present invention, the semiconductor integrated circuit has a voltage generator and a power-on circuit. The voltage generator generates an internal supply voltage supplied to internal circuits under control of the reference voltage by using an external supply voltage supplied from the exterior. The power-on circuit inactivates a power-on reset signal which resets at least one of the internal circuits (predetermined internal circuit(s)) when both the external supply voltage and the internal supply voltage exceed a predetermined value. The voltage generator forcibly supplies the external supply voltage as the internal supply voltage when the power-on reset signal is activated. Therefore, the internal supply voltage is generated following the external supply voltage when the external supply voltage is low and the voltage generator does not normally operate as in the case where the power is turned on.

According to another aspect of the semiconductor integrated circuit in the present invention, the voltage generator has a differential amplifier and a regulator. The differential amplifier outputs a differentially amplified signal upon receiving the reference voltage and a voltage that fluctuates depending on the internal supply voltage. Under control of the output of the differential amplifier, the regulator generates an internal supply voltage by using the external supply voltage. Since the power-on reset signal controls the differential amplifier or the regulator, the regulator is forcibly turned on when the power-on reset signal is activated. As a result, when the differential amplifier does not normally operate or the reference voltage is not normally generated because the external power voltage is low, the internal supply voltage is generated following the external supply voltage.

According to another aspect of the semiconductor integrated circuit in the present invention, the differential amplifier has a CMOS current-mirror circuit. The CMOS current-mirror circuit, in general, requires for its operation an external supply voltage twice or more greater than the threshold voltage of a transistor. That is, the differential amplifier composed of a CMOS current-mirror circuit has a small operation margin at the low supply voltage side. The internal supply voltage can be reliably generated even where such CMOS current-mirror circuit is used in the voltage generator.

According to another aspect of the semiconductor integrated circuit in the present invention, the voltage generator has a transistor for connecting an external supply line supplied with an external supply voltage, to an internal supply line supplied with an internal supply voltage. The transistor is forcibly turned on to connect the external supply line and the internal supply line when the power-on reset signal is activated. Therefore, when a circuit for generating the internal supply voltage in the voltage generator does not operate normally due to a low external supply voltage(when the power-on reset signal is activated), the internal supply voltage is generated following the external supply voltage.

According to another aspect of the semiconductor integrated circuit in the present invention, the semiconductor integrated circuit has a plurality of voltage generators. The power-on circuit has a plurality of reset signal generators corresponding to the internal supply voltages generated by the voltage generator and the external supply voltage, respectively. Each reset signal generator inactivates a reset signal when the external supply voltage or the internal supply voltage exceeds a predetermined value. The power-on reset signal is inactivated in response to a reset signal which has been activated latest while activated in response to a reset signal which has been activated earliest. Consequently, the internal circuit for receiving a power-on reset signal can be reliably supplied with a supply voltage at a predetermined value required for its operation and can be reset to a predetermined state when the power-on reset signal is inactivated. Furthermore, the internal circuit immediately terminates its operation at the time of activation of the power-on reset signal.

According to another aspect of the semiconductor integrated circuit in the present invention, the semiconductor integrated circuit has a voltage generator for generating an internal supply voltage lower than the external supply voltage. The power-on circuit has a logical operation circuit and a level shifter. The logical operation circuit logically operates the reset signals and outputs the operation result as a power-on reset signal. The level shifter receives the reset signal corresponding to the internal supply voltage lower than the external supply voltage to raise a logic level of the reset signal on the high voltage side and supplies the raised reset signal to the logical operation circuit. Therefore, it is possible to simply generate the power-on reset signals by using the logical operation circuit. The high level of the reset signal is raised to a predetermined value by the level shifter, which enables transmission of the high level to the logical operation circuit with reliability and secure operation of the logical operation circuit. In particular, in the case where the operation circuit is composed of CMOS, the flow of feedthrough current can be prevented.

According to one of the aspects of a method for generating internal supply voltages in a semiconductor integrated circuit in the present invention, under control of a reference voltage, an internal supply voltage to be supplied to an internal circuit is generated by using an external supply voltage supplied from the exterior. The power-on reset signal for resetting at least one of the internal circuits (predetermined internal circuit(s)) is inactivated when the external supply voltage and the internal supply voltage both exceed a predetermined value. Further, the external supply voltage is forcibly supplied as an internal supply voltage when the power-on reset signal is activated. Therefore, the internal supply voltage is generated following the external supply voltage even when the voltage generator for generating an internal supply voltage does not normally operate due to a low external supply voltage such as in a case where the power is turned on.

According to another aspect of the method for generating internal supply voltages in a semiconductor integrated circuit in the present invention, a plurality of kinds of internal supply voltage is generated to be supplied into the internal circuits. Reset signals respectively corresponding to supply voltages are inactivated when the external supply voltage and each internal supply voltage exceed a predetermined value. The power-on reset signal is inactivated in response to the reset signal which has been inactivated latest while activated in response to the reset signal which has been activated earliest. Consequently, the internal circuit for receiving a power-on reset signal can be reliably supplied with supply voltage at a predetermined value required for its operation and can be reset to a predetermined state when the power-on reset signal is inactivated. Furthermore, the internal circuit immediately terminates its operation at the time of activation of the power-on reset signals.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 6 is a waveform diagram showing supply voltages, reset signals, and power-on reset signals when the power is turned on;

DESCRIPTION OF THE PREFERRED EMBODIMENTS

Hereinafter, a description is given of embodiments of the present invention with reference to the accompanying drawings.

Figure 1:
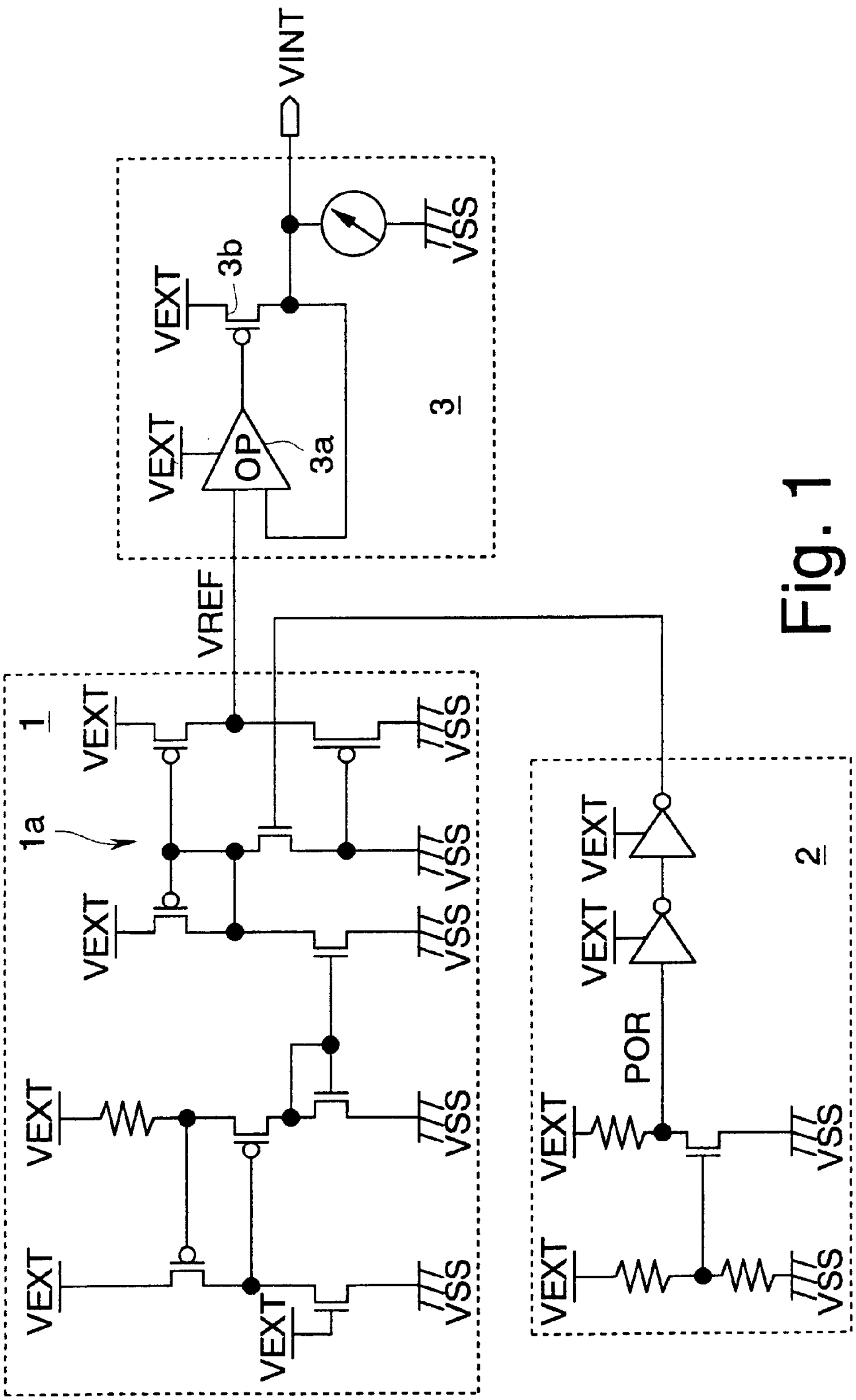
FIG. 1 is a circuit diagram showing a generator of internal supply voltages in a prior art semiconductor integrated circuit.
Figure 2:
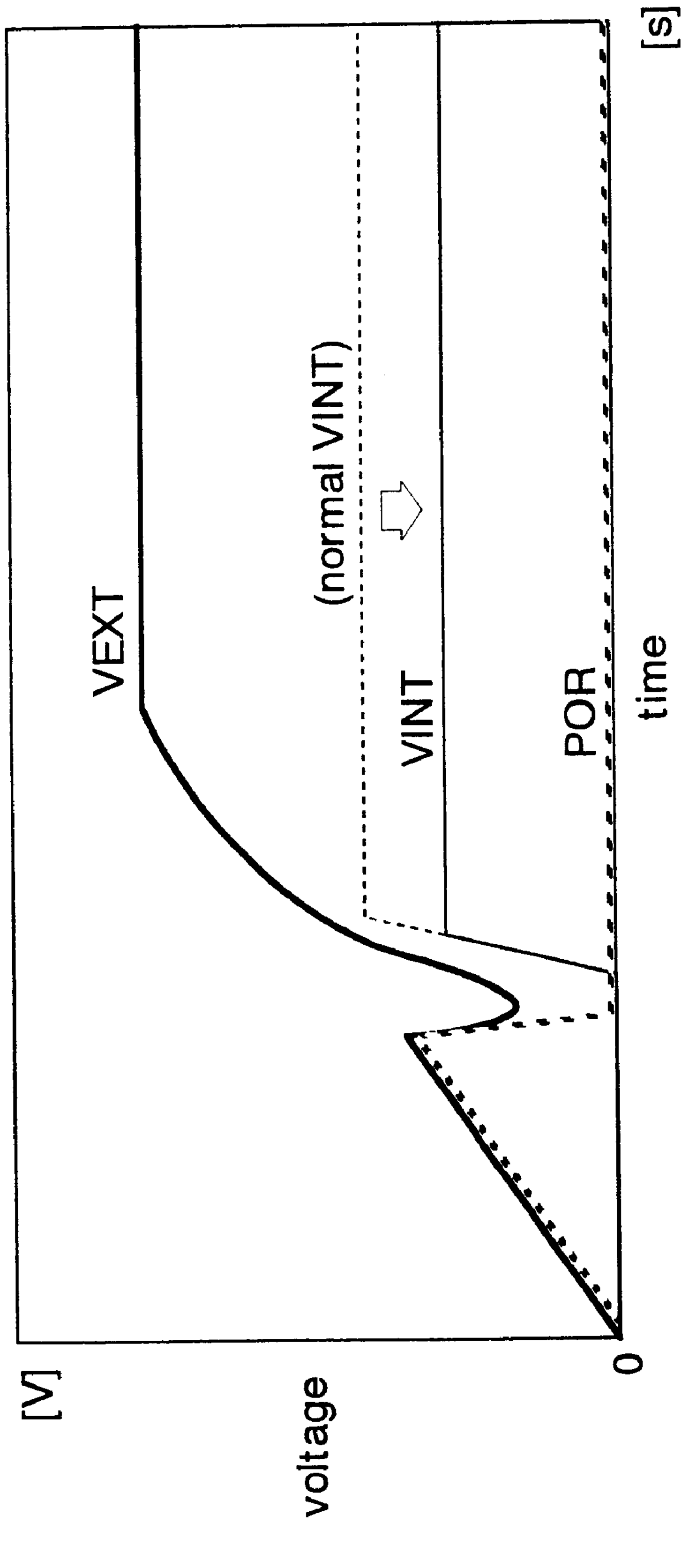
FIG. 2 is a waveform diagram of a supply voltage and a power-on reset signal when the power is turned on in a prior art circuit.
Figure 3:
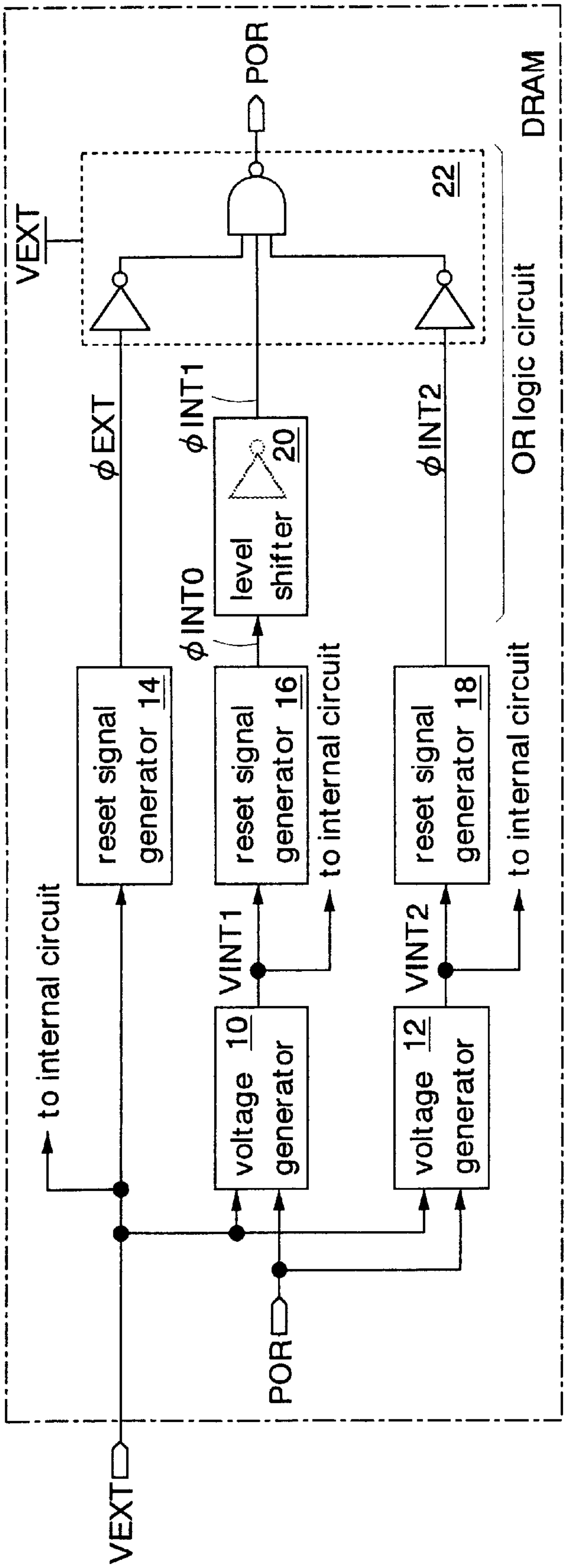
FIG. 3 is a block diagram showing a first embodiment of the present invention.

FIG. 3 shows the first embodiment of a semiconductor integrated circuit and a method for generating internal supply voltages in the semiconductor integrated circuit according to the present invention.

The semiconductor integrated circuit is formed on a silicon substance as a DRAM by using a CMOS process.

The DRAM has voltage generators 10 and 12, reset signal generators 14, 16 and 18, a level shifter 20, and a logical operation circuit 22. The DRAM further has a memory core unit including a memory cell, a sense amplifier, etc. and a plurality of control circuits or the like for controlling the memory core unit, in addition to those shown in the drawing. The DRAM receives an external supply voltage VEXT (for example, 3V) from the exterior. The external supply voltage VEXT is supplied to internal circuits such as an input buffer, an output buffer (not shown), etc. The voltage generator 10 receives the external supply voltage VEXT and a power-on reset signal POR and generates an internal supply voltage VINT1 (for example, 2V) lower than the external supply voltage VEXT. The voltage generator 12 receives the external supply voltage VEXT and the power-on reset signal POR, and generates an internal supply voltage VINT2 (for example, 4V) higher than the external supply voltage VEXT. The internal supply voltage VINT1 is provided to the internal circuit of the memory core unit, etc. The internal supply voltage VINT2 is provided to internal circuits of a word decoder or the like to be used for a high-level voltage of a word line that controls the transmission gate of a memory cell.

The reset signal generator 14 receives the external supply voltage VEXT and generates a reset signal ϕEXT. The reset signal ϕEXT is inactivated (going to a low level) when the external supply voltage VEXT exceeds a predetermined value. The reset signal generator 16 receives the internal supply voltage VINT1 and generates a reset signal ϕINT0. The reset signal ϕINT0 is inactivated (going to a low level) when the internal supply voltage VINT1 exceeds a predetermined value. Similarly, the power-on reset signal generator 18 receives the internal supply voltage VINT2 and generates a reset signal ϕINT2. The reset signal ϕINT2 is inactivated (going to a low level) when the internal supply voltage VINT2 exceeds a predetermined value.

The level shifter 20 converts the high level of the reset signal ϕINT0 (the same level as that of the internal supply voltage VINT1) the level of the external supply voltage VEXT, and outputs the same as the reset signal ϕINT1.

The logical operation circuit 22 is composed of an inverter and an NAND gate, and receives the external supply voltage VEXT. The logical operation circuit 22 inactivates the power-on reset signal POR in response to the reset signals ϕEXT, ϕINT1 and ϕNT2 that are inactivated latest while it activates the power-on reset signal POR in response to the reset signals ϕEXT, ϕINT1 and ϕINT2 that are activated earliest. That is, in this embodiment, the level shifter 20 and the logical operation circuit 22 constitute an OR logic circuit. Since the high level of the reset signal ϕINT0 is converted to the external supply voltage VEXT by the level shifter 20, it is possible to prevent flow of a feedthrough current to the NAND gate of the logical operation circuit 22 when all the reset signals ϕEXT, ϕINT1, and ϕINT2 are at a high level.

Figure 4:
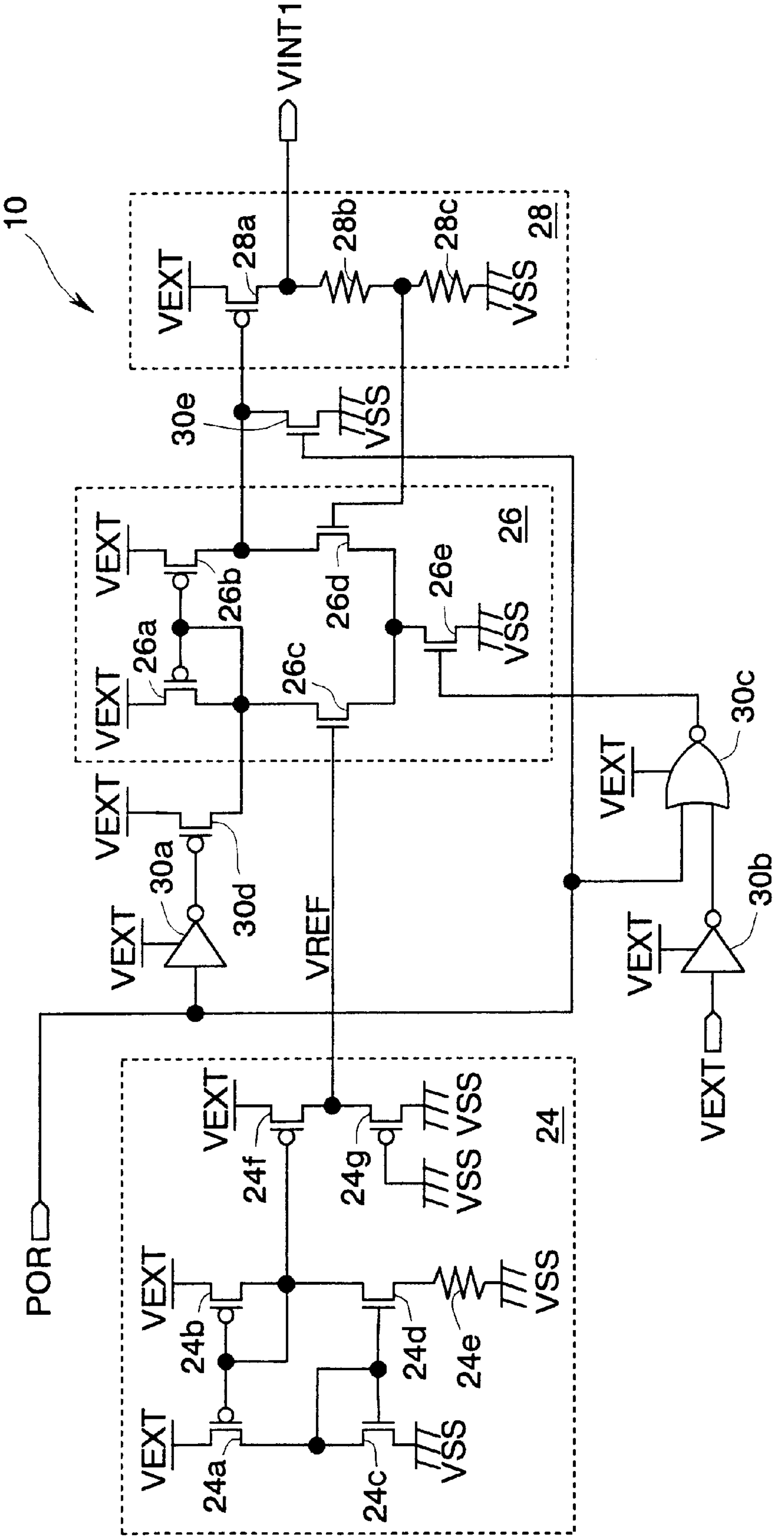
FIG. 4 is a circuit diagram showing the detail of a voltage generator shown in FIG. 3.

FIG. 4 shows the details of the voltage generator 10. In the following description, a power supply line supplied with the external supply voltage VEXT is called a "power supply line VEXT", a ground line supplied with a ground voltage VSS is called a "ground line VSS", and a power supply line supplied with the internal supply voltages VINT1 and VINT2 is called "internal supply lines VINT1 and VINT2". In addition, a pMOS transistor is called "pMOS", and an nMOS transistor "nMOS" for simplicity.

The voltage generator 10 has a reference voltage generator 24, a differential amplifier 26 composed of a current-mirror circuit, a regulator 28, inverters 30*a* and 30*b* that control the differential amplifier 26, a NOR gate 30*c*, a pMOS 30*d*, and an nMOS 30*e*.

The reference voltage generator 24 has a current-mirror circuit including pMOS 24*a* and 24*b*, nMOS 24*c* and 24*d*, and a resistor 24*e*, and a voltage generator including pMOS 24*f* and 24*g* connected in series. The source of pMOs 24*a*, 24*b*, and 24*f* is connected to the power supply line VEXT. The source of the nMOS 24*c*, gate and drain of pMOS 24*g* and one end of resistor 24*e* are connected to the ground line VSS. The gate of pMOS 24*a*, gate and drain of pMOS 24*b*, drain of nMOS 24*d*, and gate of pMOS 24*f* are connected to each other. The drain of pMOS 24*a*, gate and drain of nMOS 24*c*, and gate of nMOS 24*d* are connected to each other. The source of nMOS 24*d* is connected to the other end of the resistor 24*e*. The drains of pMOS 24*f* and nMOS 24*g* are connected to each other to output the reference voltage VREF.

The differential amplifier 26 has pMOS 26*a* and 26*b*, nMOS 26*c*, 26*d* and 26*e*. The sources of pMOS 26*a* and 26*b* are connected to the power supply line VEXT. The source of nMOS 26*e* is connected to the ground line VSS. The gate of nMOS 26*e* is connected to the output of NOR gate 30*c*. The gate and drain of pMOS 26*a*, gate of pMOS 26*b*, and drain of nMOS 26*c* are connected to the drain of nMOS 30*d*. The drain of pMOS 26*b* and drain of nMOS 26*d* are connected to the drain of nMOS 30*e* and the gate of pMOS 28*a* of the regulator 28. The gate of nMOS 26*c* receives the reference voltage VREF. The gate of nMOS 26*d* is connected to the resistors 28*b* and 28*c* of the regulator 28, and receives voltage that changes following the internal supply voltage VINT1. The sources of the nMOS 26*c* and 26*d* are connected to the drain of nMOS 26*e.*

The regulator 28 has pMOS 28*a,* resistors 28*b* and 28*c* connected in series. The pMOS 28*a* connects the source to the power supply line VEXT and connects the drain to one end of the resistor 28*b.* The drain of the pMOS 28*a* outputs the internal supply voltage VINT1. The other end of the resistor 28*b* is connected to one end of the resistor 28C, and the other of the resistor 28C is connected to the ground line VSS.

The inverter 30*a* receives a power-on reset signal POR, and outputs the inverted signal to the gates of pMOS 30*d.* The inverter 30*b* receives the external supply voltage VEXT, and outputs the inverted signal to the input of the NOR gate 30*c.* The sources of pMOS(not shown) of the inverters 30*a,* 30*b* and the NOR gate 30*c* are connected to the power supply line VEXT. The source of the pMOS 30*d* is connected to the power supply line VEXT while the source of nMOS 30*e* is connected to the ground line VSS.

On the other hand, although not shown specially, the voltage generator 12 has, for example, a boost circuit for pumping the capacitance by a pulse signal outputted from an oscillation circuit and for generating a high voltage by utilizing a transistor connected to a diode.

Figure 5:
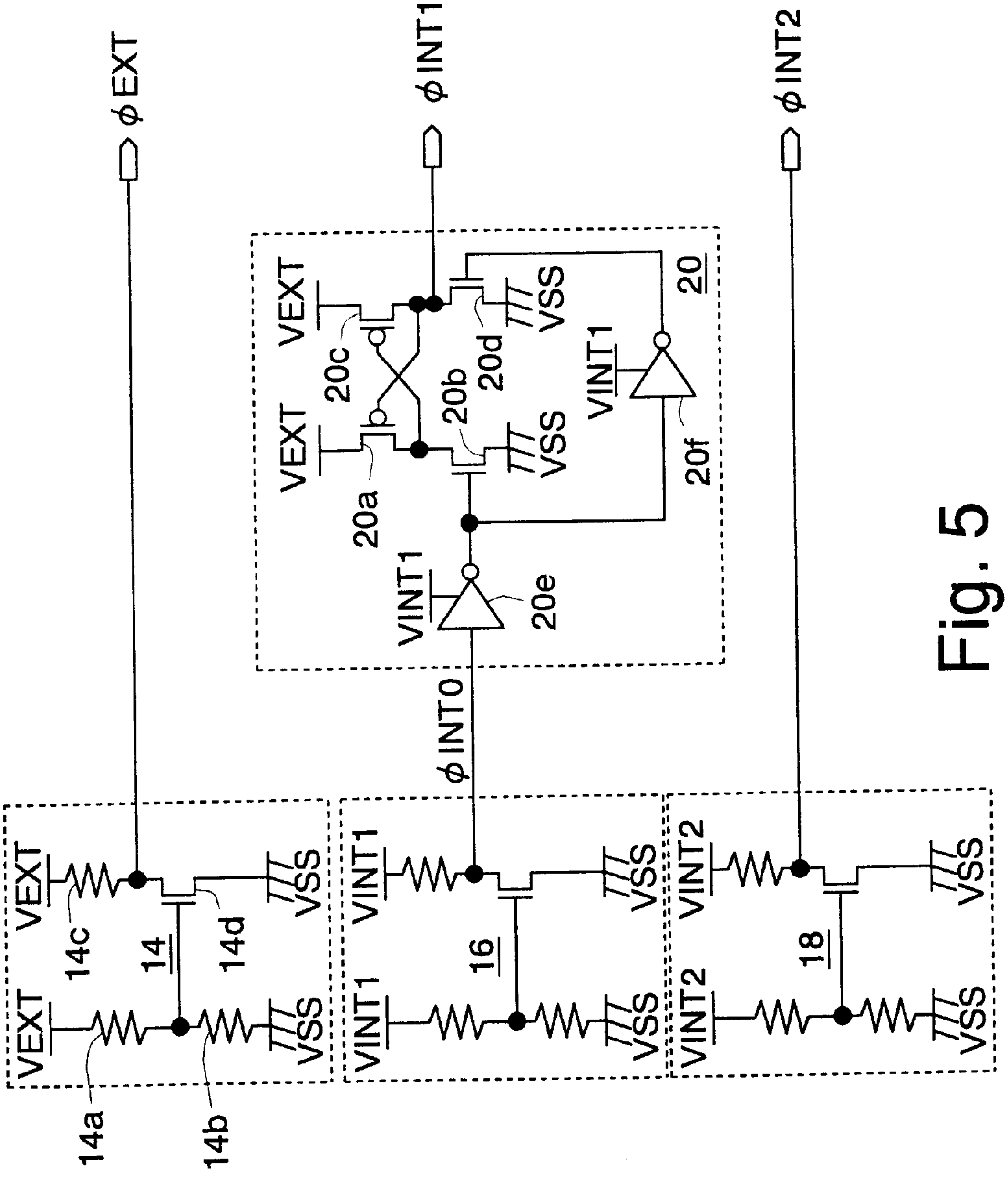
FIG. 5 is a circuit diagram showing the detail of a reset signal generator and a level shifter, which are shown in FIG. 3.

FIG. 5 shows the detail of the reset signal generators 14, 16, and 18 and the level shifter 20.

The reset signal generator 14 has resistors 14*a* and 14*b* connected in series and resistors 14*c* and nMOS 14*d* connected in series. The one ends of the resistors 14*a* and 14*b* are respectively connected to the power supply line VEXT and the ground line VSS. One end of the resistor 14*c* is connected to the power supply line VEXT, and the source of nMOS 14*d* is connected to the ground line VSS. The connected nodes of the resistor 14*a* and the nMOS 14*b* are connected to the gate of nMOS 14*d.* A reset signal ϕEXT is outputted from the connected nodes of the resistor 14*c* and the nMOS 14*d.* The nMOS 14*d* is turned off when the external supply voltage VEXT is less than a predetermined value, and at this time, the reset signal ϕEXT goes to a low level. The nMOS 14*d* is turned on when the external supply voltage exceeds the predetermined value. At this time, the reset signal NEXT is turned to a high level.

The reset signal generators 16 and 18 have the same logic as that of the reset signal generator 14. The reset signal generator 16 receives the internal supply voltage VINT1 and outputs a reset signal ϕINT0. The reset signal generator 18 receives the internal supply voltage VINT2 and outputs a reset signal ϕINT2.

The level shifter 20 is composed of pMOS 20*a* and nMOS 20*b* connected in series, pMOS 20*c* and nMOS 20*d* connected in series, and inverters 20*e* and 20*f.* The sources of the pMOS 20*a* and 20*c* are connected to the power supply line VEXT. The sources of nMOS 20*b* and 20*d* are connected to the ground line VSS. The gate of nMOS 20*b* receives an inverted signal of the reset signal ϕINT0 via the inverter 20*e.* The gate of nMOS 20*d* receives a signal of the same phase as that of the reset signal ϕINT0 via the inverters 20*e* and 20*f.* The gate of pMOS 20*a* is connected to the drain of the pMOS 20*c,* and the gate of the pMOS 20*c* is connected to the drain of the pMOS 20*a.* The reset signal ϕINT1 is outputted from the drain of the pMOS 20*c.* The source of pMOS (not shown) of the inverters 20*e* and 20*f* is connected to the internal supply line ϕINT1.

Figure 6:
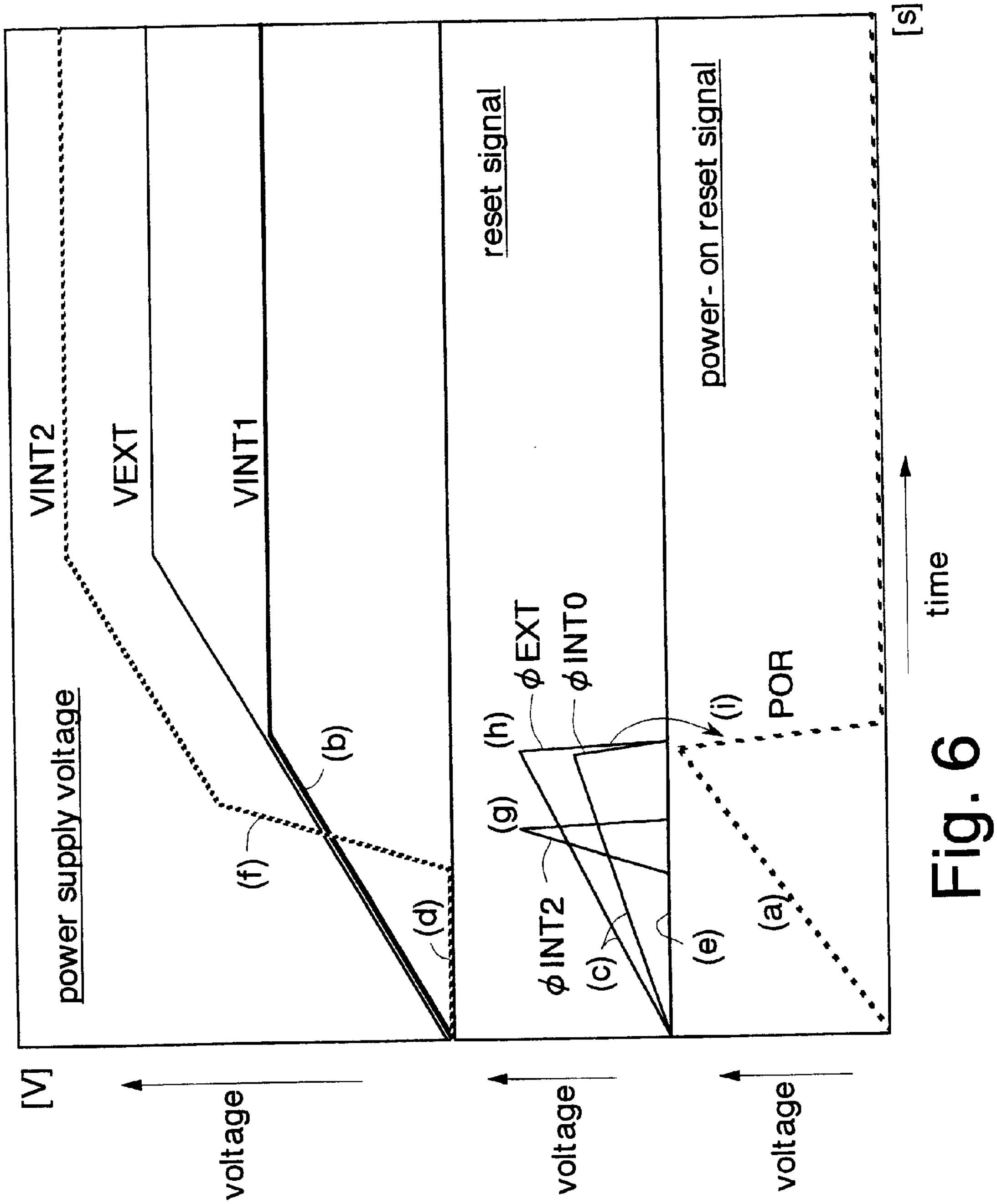

FIG. 6 shows waveforms of respective supply voltages VEXT, VINT1 and VINT2, reset signals ϕEXT, ϕINT1, and ϕINT2, and a power-on reset signal POR.

First, the voltage of the power-on reset signal POR goes up as the external supply voltage VEXT rises (FIG. 6(*a*)). With the rise of the voltage of the power-on reset signal POR, the pMOS 30*d* and nMOS 30*e* shown in FIG. 4 are turned on and the nMOS 26*e* is turned off. The differential amplifier 26 is inactivated by turning the pMOS 30*d* on and the nMOS 26*e* off. The pMOS 28*a* is turned on by the turning-on of the nMOS 30*e,* and the external supply voltage VEXT is forcibly supplied as the internal supply voltage VINT1. That is, the internal supply voltage VINT1 follows the external supply voltage VEXT (FIG. 6(*b*)). The internal circuits that receive the internal supply voltage VINT1 goes into an operable state at the shortest time.

The reset signal generators 14 and 16 shown in FIG. 5 raise the voltage of the reset signals ϕEXT and ϕINT0 with the rises of the external supply voltage VEXT and the internal supply voltage VINT1 (FIG. 6(*c*)). The voltage generator 12 shown in FIG. 3 does not operate until the external supply voltage VEXT exceeds a predetermined value so it does not generate any internal supply voltage VINT2 (FIG. 6(*d*)). Therefore, a reset voltage ϕINT2 is not generated (FIG. 6(*e*)). When the voltage generator 12 starts operating, the internal supply voltage VINT2 rapidly goes up (FIG. 6(*f*)). The reset signal generator 18 shown in FIG. 5 is inactivated after it raises (activates) the voltage of the reset signal ϕINT2 with the rise of the internal supply voltage VINT2 (FIG. 6(*g*)).

After that, the reset signal generators 14 and 16 are inactivated after raising (activating) the voltages of the reset signals ϕEXT and ϕINT0 with the rises of the external supply voltage VEXT and the internal supply voltage VINT1 (FIG. 6(*h*)). The reset signal ϕINT0 is converted to the reset signal ϕINT1 via the level shifter. The logical operation circuit 22 shown in FIG. 3 inactivates the power-on reset signal POR in response to a signal lately inactivated, of the reset signals ϕEXT and ϕINT1 (FIG. 6(*i*)). That is, the power-on reset signal POR is inactivated in response to the supply voltages VEXT, VINT1 and VINT2 whose rises are latest. The internal circuit for which the resetting is required is able to reliably receive a supply voltage at a predetermined value necessary for its operation before the inactivation of the power-on reset signal POR. As a result, the internal circuit is always placed in a predetermined reset state when the power is turned on. Control over generation of a power-on reset signal POR by logically operating the reset signal and control over conversion of the logical voltage of the reset signal are important especially in a semiconductor integrated circuit including a supply voltage generator to generate a plurality of kinds of supply voltage like a recent DRAM.

On the other hand, the power-on reset signal POR is activated in response to reset signals ϕEXT, ϕINT1, and ϕINT2 that have been activated earliest(not shown). Therefore, the power-on reset signal POR is activated in response to the supply voltages VEXT, VINT1 and VINT2 that have fallen earliest. As a result, the internal circuit that receives the power-on reset signal POR quickly stops its operation.

As described above, in the semiconductor integrated circuit and the method for generating internal supply voltages in a semiconductor integrated circuit according to the present invention, the voltage generator 10 inactivates the differential amplifier 26 upon receiving the activation of the power-on reset signal POR, and simultaneously supplies a low level to the gate of pMOS 28*a* of the regulator 28, whereby the external supply voltage VEXT is forcibly supplied as the internal supply voltage VINT1. Therefore, in case where the external supply voltage VEXT is low and the differential amplifier 26 does not operate normally, the internal supply voltage VINT1 following the external supply voltage VEXT can be generated. This brings about a remarkable effect particularly in a differential amplifier 26 composed of a CMOS current-mirror circuit.

The power-on reset signal POR is inactivated in response to the reset signal that is inactivated latest while activated in response to the reset signal that is activated earliest. Therefore, the internal circuit that receives the power-on reset signal POR can securely receive a supply voltage at a predetermined value necessary for the operation when the power-on reset signal POR is inactivated. As a result, the internal circuit can be reset to a predetermined state with reliability. Therefore, the internal circuit that receives the power-on reset signal POR can stop its operation earlier when the power-on reset signal POR is activated.

The logical operation circuit 22 logically operates respective reset signals φEXT, φINT0 and φINT2, and outputs the result of logical operation as the power-on reset signal POR. Accordingly, it is possible to simply generate the power-on reset signal POR.

The high level (internal supply voltage VINT1) of the reset signal φINT0 is converted to the external supply voltage VEXT via the level shifter 20, and is supplied to the logical operation circuit 22. Accordingly, the high level of the reset signal φINT0 can be securely transmitted to the logical operation circuit 22, thereby securely operating the logical operation circuit 22 without malfunction. In particular, it is possible to prevent a feedthrough current from flowing into the NAND gate of the logical operation circuit 22.

Figure 7:
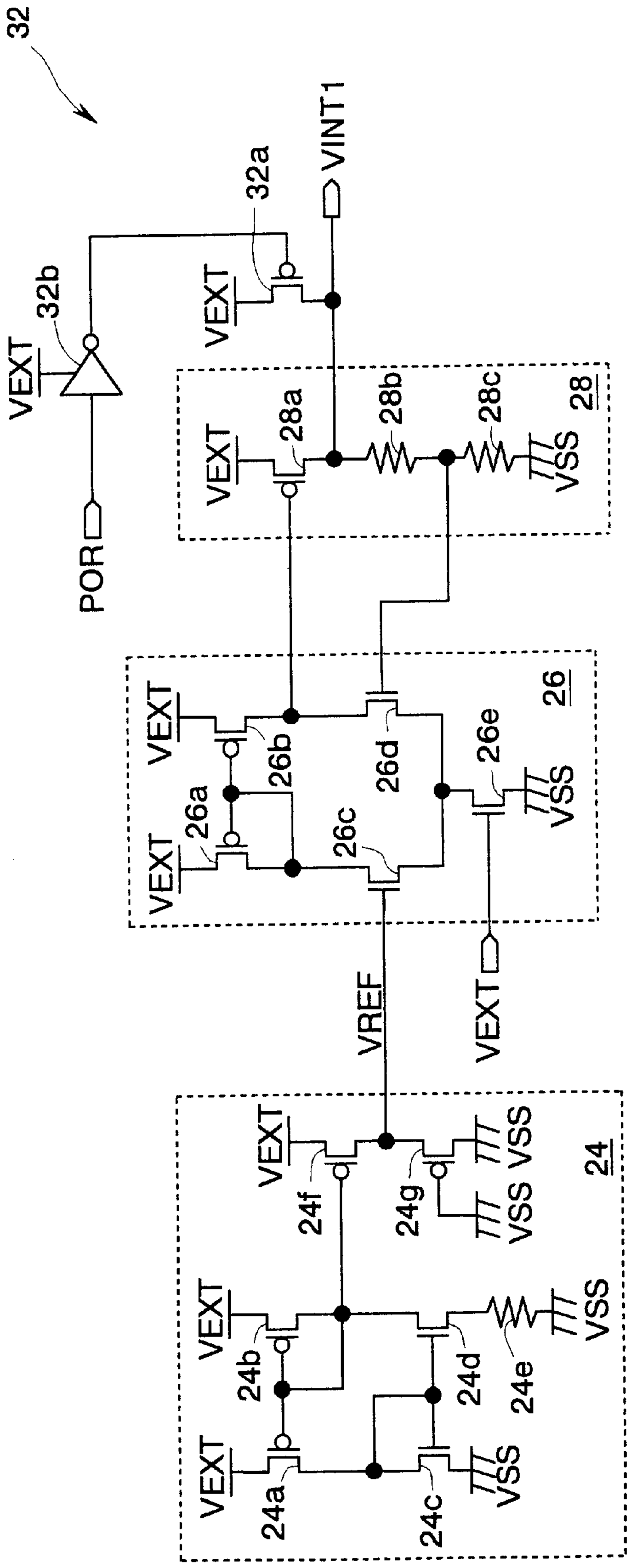
FIG. 7 is a circuit diagram showing the detail of a voltage generator according to a second embodiment of the present invention.

FIG. 7 shows a second embodiment of a semiconductor integrated circuit and a method for generating internal supply voltages in the semiconductor integrated circuit according to the present invention. The same circuits as those of the first embodiment are given the same reference numbers, and detailed description thereof is omitted.

In the second embodiment, a voltage generator 32 differs from the voltage generator 10 in the first embodiment. All the other constructions are identical to those of the first embodiment.

The voltage generator 32 has a reference voltage generator 24, a differential amplifier 26, and a regulator 28 that are identical to those of the voltage generator 10 shown in FIG. 4. The connection among the reference voltage generator 24, differential amplifier 26, and regulator 28 is the same as that in the first embodiment. The drain of pMOS 32*a* is connected to the node that outputs the internal supply voltage VINT1. The source of the pMOS 32*a* is connected to the power supply line VEXT. The gate of the pMOS 32*a* receives an inverted signal of the power-on reset signal POR via an inverter 32*b*.

In the embodiment, the pMOS 32*a* is turned on when the power-on reset signal POR is activated (when the external supply voltage VEXT is less than a predetermined value), and the external supply voltage VEXT is forcibly supplied as the internal supply voltage VINT1.

It is possible to obtain similar effects to those of the first embodiment described above in this embodiment.

Figure 8:
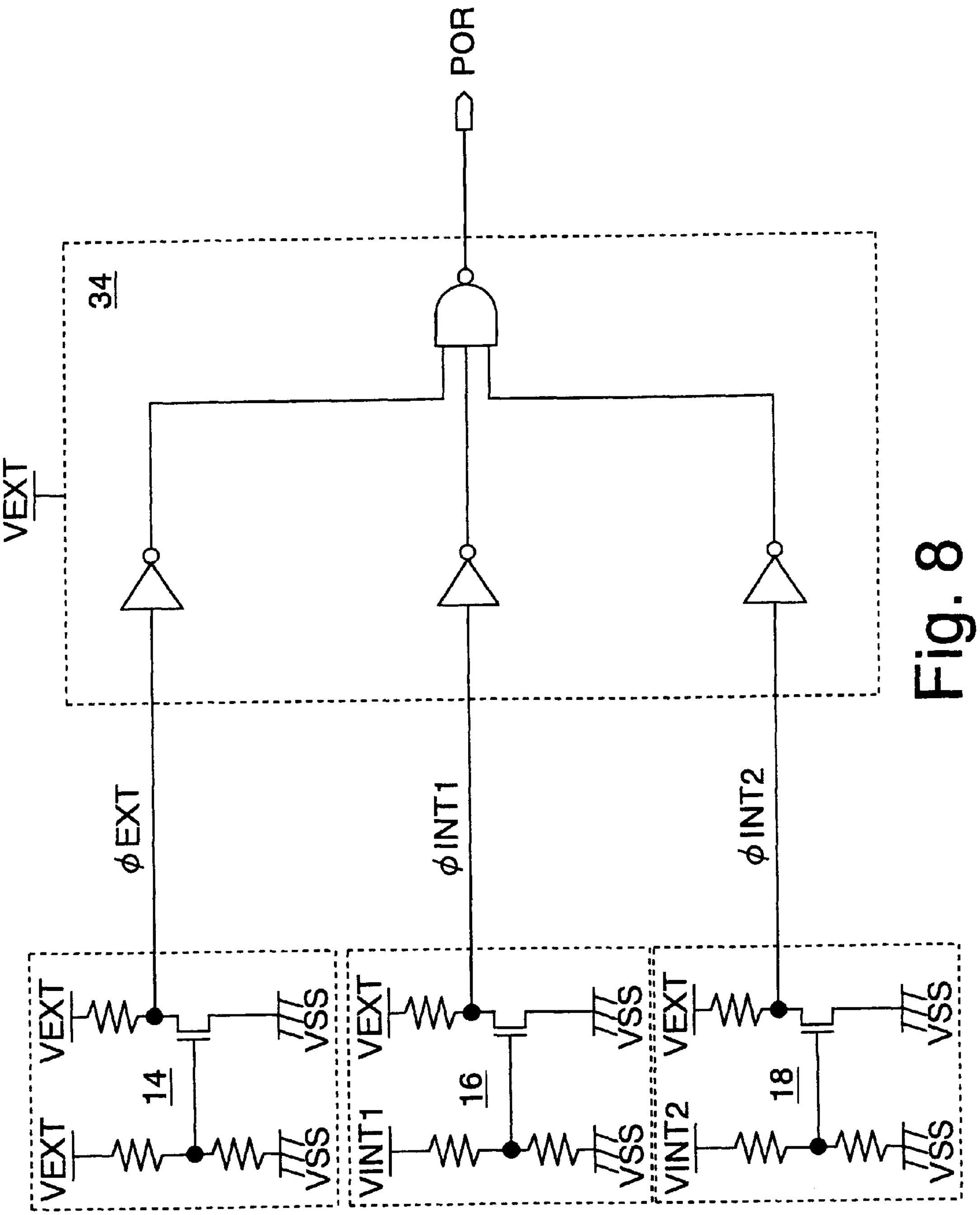
FIG. 8 is a circuit diagram showing a reset signal generator and a logical operation circuit according to a third embodiment of the present invention.

FIG. 8 shows a third embodiment of a semiconductor integrated circuit and a method for generating internal supply voltages in the semiconductor integrated circuit according to the present invention. The circuits that are identical to those in the first embodiment are given the same reference numbers, and detailed description thereof is omitted.

In the third embodiment, the supply voltage supplied to the reset signal generators 16 and 18 and the logical operation circuit 34 thereof are different from those in the first embodiment. In addition, the semiconductor integrated circuit does not have any level shifter.

In the reset signal generator 16 the external supply voltage VEXT is supplied to a resistor connected to the node, which generates a reset signal φINT1. In the reset signal generator 18 the external supply voltage VEXT is supplied to a resistor connected to the node, which generates a reset signal φINT2. That is, the reset signal generators 16 and 18 have a function of the level shifter in this embodiment. The logical operation circuit 34 is composed as an OR circuit having an inverter and an NAND gate combined. The external supply voltage VEXT is supplied to the logical operation circuit 34.

It is also possible to obtain similar effects to those of the first embodiment described above. Further, in this embodiment, a semiconductor integrated circuit supplied with a plurality of kinds of internal supply voltage does not require to have a level shifter to generate a power-on reset signal POR.

In the above-described embodiments, a description has been given of an example in which the present invention is applied to control over generation of the internal supply voltage VINT1 supplied to the memory core unit and the internal supply voltage VINT2 of a high level voltage, which is supplied to the word line. However, the present invention is not limited to such embodiments. For example, it may be applicable to control over generation of a precharge voltage (for example, 1.5V) for resetting a bit line, a substrate voltage (for example, −2V) of a p-type silicon substrate (or a p-well of a memory cell), or a reset voltage (for example, −1V) to supply a low level voltage to the word line, etc.

In the above-described embodiments, a description has been given of an example in which the present invention is applied to DRAMs. However, the present invention is not limited to such embodiments. For example, the present invention may be applicable to a semiconductor memory such as SRAMs, FeRAMs (Ferroelectric RAMS), or FLASH memories. Further, it may also be applicable to a system LSIs implementing a DRAM memory core, a microcomputer, a logic LSI, etc.

Furthermore, a process to produce a semiconductor, to which the present invention is applied, is not limited to a CMOS process, but it may be applicable to a Bi-CMOS process.

The invention is not limited to the above embodiments and various modifications may be made without departing from the spirit and the scope of the invention. Any improvement may be made in part or all of the components.

What is claimed is:

1. A semiconductor integrated circuit comprising:

a voltage generator for generating an internal supply voltage supplied to internal circuits based on a reference voltage by using an external supply voltage;

a first power-on circuit for generating a first power-on reset signal and for inactivating the first power-on reset signal which resets at least one of said internal circuits when said internal supply voltage exceeds a first predetermined value;

a second power-on circuit for generating a second power-on reset signal and for inactivating the second power-on reset signal which resets at least one of said internal circuits, when said external supply voltage exceeds a second predetermined value; and a logic circuit for generating a third power-on reset signal and for inactivating the third power-on reset signal when both said first power-on reset signal and said second power-on reset signal are inactivated, and wherein said voltage generator supplies said external supply voltage as said internal supply voltage when said third power-on reset signal is activated.

2. The semiconductor integrated circuit according to claim 1, wherein said voltage generator comprises:

a differential amplifier for receiving said reference voltage and a voltage that fluctuates depending on said internal supply voltage; and a regulator controlled on the basis of an output of said differential amplifier for generating said internal supply voltage by using said external supply voltage, and wherein:

said power-on reset signal controls one of said differential amplifier and said regulator; and said regulator is turned on when said power-on reset signal is activated.

3. The semiconductor integrated circuit according to claim 2, wherein said differential amplifier comprises a CMOS current-mirror circuit.

4. The semiconductor integrated circuit according to claim 1, wherein:

said voltage generator comprises a transistor for connecting an external supply line supplied with said external supply voltage, to an internal supply line supplied with said internal supply voltage; and said transistor is turned on when said power-on reset signal is activated.

5. The semiconductor integrated circuit according to claim 1, wherein said logic circuit inactivates said third power-on reset signal in response to one of said first and second power-on reset signals which is inactivated later and is activated in response to said first and second power-on reset signal which is activated earlier.

6. The semiconductor integrated circuit according to claim 5, comprising a level shifter for receiving said first power-on reset signal to raise a logic level of said first power-on reset signal on the high voltage side, wherein said voltage generator generates said internal supply voltage lower than said external supply voltage; and said logic circuit has a logical operation circuit for logically operating values represented by the raised first power-on reset signal and said second power-on reset signal to output the operation result as said third power-on reset signal.

7. The semiconductor integrated circuit according to claim 5, wherein:

said voltage generator generates said internal supply voltage lower than said external supply voltage;

said first power-on circuit has a transistor for receiving a control voltage generated by dividing said internal supply voltage with resistance, and a resistor having one end connected with a drain of said transistor and the other end supplied with said external supply voltage; and said first power-on reset signal is generated from a connected node of said transistor and said resistor.

8. The semiconductor integrated circuit according to claim 1, wherein said first predetermined value and said second predetermined value are both equal values.

9. A method for generating internal supply voltage in a semiconductor integrated circuit, comprising the steps of:

generating an internal supply voltage for supplying to internal circuits based on a reference voltage by using an external supply voltage;

generating a first power-on reset signal and inactivating the first power-on reset signal which resets at least one of said internal circuits when said first internal supply voltage exceeds a first predetermined value;

generating a second power-on reset signal and inactivating the second power-on reset signal which resets at least one of said internal circuits, when said external supply voltage exceeds a second predetermined value;

generating a third power-on reset signal and inactivating the third power-on reset signal when both said first power-on reset signal and said second power-on reset signal are inactivated; and supplying said external supply voltage as said internal supply voltages when said third power-on reset signal is activated.

10. The method for generating internal supply voltage in a semiconductor integrated circuit according to claim 9, comprising the steps of:

inactivating said third power-on reset signal in response to one of said first and second power-on reset signals which is inactivated later; and activating said third power-on reset signal in response to one of said first and second power-on reset signals which is activated earlier.

11. The method for generating internal supply voltage in a semiconductor integrated circuit according to claim 9, comprising the steps of:

inactivating said third power-on reset signal in response to one of said first, second, and third power-on reset signals which is inactivated latest; and activating said third power-on reset signal in response to one of said first, second, and third power-on reset signals which is activated earliest.

12. The semiconductor integrated circuit according to claim 9, wherein said first predetermined value and said second predetermined value are both equal values.

13. A semiconductor integrated circuit comprising:

first and second voltage generators for generating first and second internal supply voltages respectively supplied to internal circuits based on a reference voltage by using an external supply voltage;

a first power-on circuit for generating a first power-on reset signal and for inactivating the first power-on reset signal which resets at least one of said internal circuits when said first internal supply voltage exceeds a first predetermined value;

a second power-on circuit for generating a second power-on reset signal and for inactivating the second power-on reset signal which resets at least one of said internal circuits when said second internal supply voltage exceeds a second predetermined value;

a third power-on circuit for generating a third power-on reset signal and for inactivating the third power-on reset signal which resets at least one of said internal circuits when said external supply voltage exceeds a third predetermined value; and a logic circuit for generating a fourth power-on reset signal and for inactivating the fourth power-on reset signal when all of said first, second, and third power-on reset signals are inactivated, and wherein said voltage generators supply said external supply voltage as said first and second internal supply voltage, respectively, when said fourth power-on reset signal is activated.

14. The semiconductor integrated circuit according to claim 13, comprising a level shifter for receiving said first power-on reset signal to raise a logic level of said first power-on reset signal on the high voltage side, wherein:

said first voltage generator generates said first internal supply voltage lower than said external supply voltage; and said logic circuit has a logical operation circuit for logically operating values represented by the raised first power-on reset signal, said second power-on reset signal, and said third power-on reset signal, to output the operation result as said fourth power-on reset signal.

15. The semiconductor integrated circuit according to claim 13, wherein said first predetermined value, said second predetermined value, and said third predetermined value are all equal values.

16. A method for generating internal supply voltage in a semiconductor integrated circuit, comprising the steps of:

generating first and second internal supply voltages supplied to internal circuits based on a reference voltage by using an external supply voltage;

generating a first power-on reset signal and inactivating the first power-on reset signal which resets at least one of said internal circuits when said first internal supply voltage exceeds a first predetermined value;

generating a second power-on reset signal and inactivating the second power-on reset signal which resets at least one of said internal circuits when said second internal supply voltage exceeds a second predetermined value;

generating a third-power-on reset signal and inactivating the third power-on reset signal which resets at least one of said internal circuits when said external supply voltage exceeds a third predetermined value;

generating a fourth power-on reset signal and inactivating the fourth power-on reset signal when all of said first, second, and third power-on reset signals are inactivated; and supplying said external supply voltage as said first and second internal supply voltages, respectively, when said fourth power-on reset signal is activated.

17. The semiconductor integrated circuit according to claim 16, wherein said first predetermined value, said second predetermined value, and said third predetermined value are all equal values.

* * * * *